(12) United States Patent
Cheng et al.

(10) Patent No.: US 12,110,379 B2
(45) Date of Patent: Oct. 8, 2024

(54) ARTICLES AND STRUCTURES WITH HIGH HEAT AND REFLECTANCE AND LASER DIRECT STRUCTURING FUNCTION

(71) Applicant: SHPP GLOBAL TECHNOLOGIES B.V., Bergen op Zoom (NL)

(72) Inventors: Yunan Cheng, Shanghai (CN); Yun Zheng, Shanghai (CN)

(73) Assignee: SHPP Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 17/800,676

(22) PCT Filed: Feb. 11, 2021

(86) PCT No.: PCT/IB2021/051127
§ 371 (c)(1),
(2) Date: Aug. 18, 2022

(87) PCT Pub. No.: WO2021/165796
PCT Pub. Date: Aug. 26, 2021

(65) Prior Publication Data
US 2023/0117110 A1    Apr. 20, 2023

(30) Foreign Application Priority Data
Feb. 20, 2020  (EP) .................... 20158616

(51) Int. Cl.
| C08K 13/06 | (2006.01) |
| C08K 3/013 | (2018.01) |
| C08K 3/22 | (2006.01) |
| C08K 3/38 | (2006.01) |
| C08K 7/06 | (2006.01) |
| C08K 7/14 | (2006.01) |
| C08K 9/02 | (2006.01) |

(52) U.S. Cl.
CPC .............. *C08K 13/06* (2013.01); *C08K 3/013* (2018.01); *C08K 3/22* (2013.01); *C08K 3/2279* (2013.01); *C08K 3/38* (2013.01); *C08K 7/06* (2013.01); *C08K 7/14* (2013.01); *C08K 9/02* (2013.01); *C08K 2003/2231* (2013.01); *C08K 2003/2241* (2013.01); *C08K 2003/385* (2013.01)

(58) Field of Classification Search
None
See application file for complete search history.

(56) References Cited

U.S. PATENT DOCUMENTS

| 5,387,645 A | 2/1995 | Montag et al. |
| 9,365,693 B2 | 6/2016 | Takano et al. |
| 2014/0147682 A1 | 5/2014 | Takano et al. |
| 2014/0309356 A1* | 10/2014 | Kim ............... C08K 3/013 524/497 |
| 2016/0215124 A1 | 7/2016 | Takano et al. |
| 2019/0269012 A1 | 8/2019 | Van Der Burgt |
| 2019/0338117 A1 | 11/2019 | Park et al. |

FOREIGN PATENT DOCUMENTS

| CN | 105623206 B | 12/2017 |
| JP | H04-142362 A | 5/1992 |
| KR | 101757191 B1 | 7/2017 |
| KR | 10-2018-0136989 A | 12/2018 |
| WO | 2014/115092 A1 | 7/2014 |
| WO | 2018/130970 A1 | 7/2018 |

OTHER PUBLICATIONS

Machine translation of Yun et al. KR101757191 (Year: 2017).*
International Search Report and Written Opinion mailed Apr. 29, 2021 in PCT/IB2021/051127 (11 pgs.).

* cited by examiner

*Primary Examiner* — Robert T Butcher
(74) *Attorney, Agent, or Firm* — Quicker Law, LLC

(57) ABSTRACT

A thermoplastic composition includes: (a) poly(cyclohexylenedimethylene terephthalate) (PCT) or a copolymer thereof; (b) at least 10 wt % of a reinforcing filler comprising glass fiber; (c) a laser direct structuring (LDS) additive comprising a tin oxide, an antimony oxide, or a combination thereof; and (d) a reflection additive comprising a titanium compound. A weight ratio of total titanium in the composition to the LDS additive in the composition is at least 0.7:1, or a weight ratio of total titanium in the composition to the PCT is 1.1:1 or less.

16 Claims, 2 Drawing Sheets

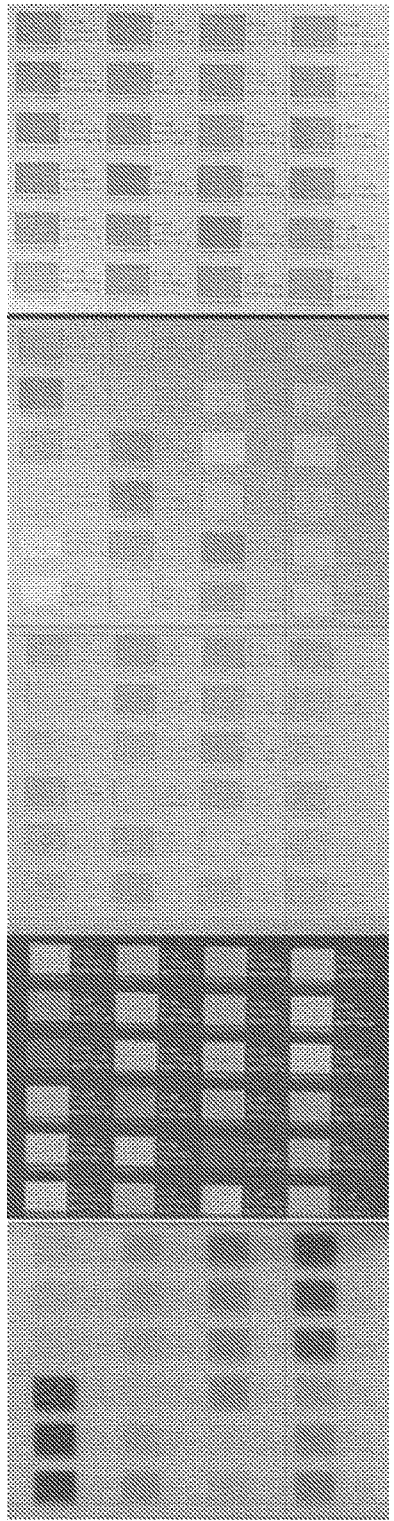
FIG. 2 – LDS-Plated Plaques of Table 2 Compositions
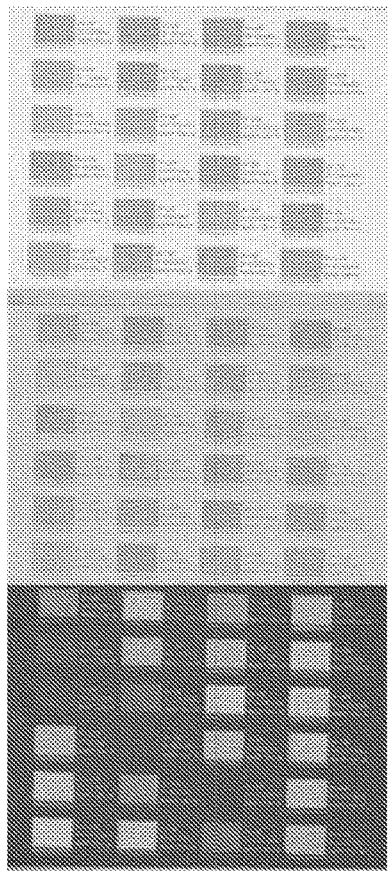
FIG. 3 – LDS-Plated Plaques of Table 3 Compositions

ARTICLES AND STRUCTURES WITH HIGH HEAT AND REFLECTANCE AND LASER DIRECT STRUCTURING FUNCTION

CROSS-REFERENCE TO RELATED APPLICATION

This application is the National Stage of International Application No. PCT/IB2021/051127 filed Feb. 11, 2021, which claims priority to and the benefit of European Application No. 20158616.1 filed Feb. 20, 2020, the disclosures of which are incorporated herein by this reference in their entireties.

FIELD OF THE DISCLOSURE

The present disclosure relates to laser plateable thermoplastic compositions, and in particular to compositions including a titanium compound to provide high reflectance properties.

BACKGROUND OF THE DISCLOSURE

Under the trend of miniaturization and integration of circuits, there is a desire to make the circuit small and combinable with other functional parts across different industries. Due in large part to its design flexibility, Laser Direct Structuring (LDS) technology has become favored as compared to conventional circuit fabrication technologies such as printed circuit board (PCB) technology. LDS polymer compositions can be combined with additives to provide additional properties (such as stiffness, color, etc.) and formed into processable pellets by conventional compounding techniques. LDS polymers have been widely accepted and used in consumer electronics industries such as mobile telecommunication devices. In particular, LDS polymers have been used in the antenna for such devices.

Some electronics industries, however, have been slow to adopt LDS technology due to technical barriers. For example, the LED industry has not yet been able to identify an easy-to-assemble and economically feasible white, high reflectance surface that is solderable with circuit integration. An LDS solution for such LED applications would be desirable.

Among conventional polymers that may be considered for such applications, liquid crystal polymer (LCP) and polyphenylene sulfide (PPS) have been discounted due to their high price. Polyphthalamide (PPA) is a semi-crystalline, aromatic polyamide that has considerable promise but also has several properties that make it undesirable for LDS applications, including water absorption, dimensional stability and color (yellowing) issues. In particular, the water absorption properties of PPA result in unstable dielectric performance of compositions including it, making it unsuitable for use in 5G network applications.

Poly(cyclohexylenedimethylene terephthalate) (PCT) can provide a high heat, white platform. Crystallization of PCT and other high-heat base resins can be adversely affected by fillers and other additives, however; as a result they have not been widely adopted in LDS applications.

These and other shortcomings are addressed by aspects of the disclosure.

SUMMARY

Aspects of the disclosure relate to a thermoplastic composition including: (a) poly(cyclohexylenedimethylene terephthalate) (PCT) or a copolymer thereof; (b) at least 10 wt % of a reinforcing filler comprising glass fiber; (c) a laser direct structuring (LDS) additive comprising a tin oxide, an antimony oxide, or a combination thereof; and (d) a reflection additive comprising a titanium compound. A weight ratio of total titanium in the composition to the LDS additive in the composition is at least 0.7:1, or a weight ratio of total titanium in the composition to the PCT is 1.1:1 or less.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document.

FIG. 2 provides photographs of LDS-plated plaques for comparative and example compositions of Example 2.

FIG. 3 provides photographs of LDS-plated plaques for comparative and example compositions of Example 3.

DETAILED DESCRIPTION

Figure 1:
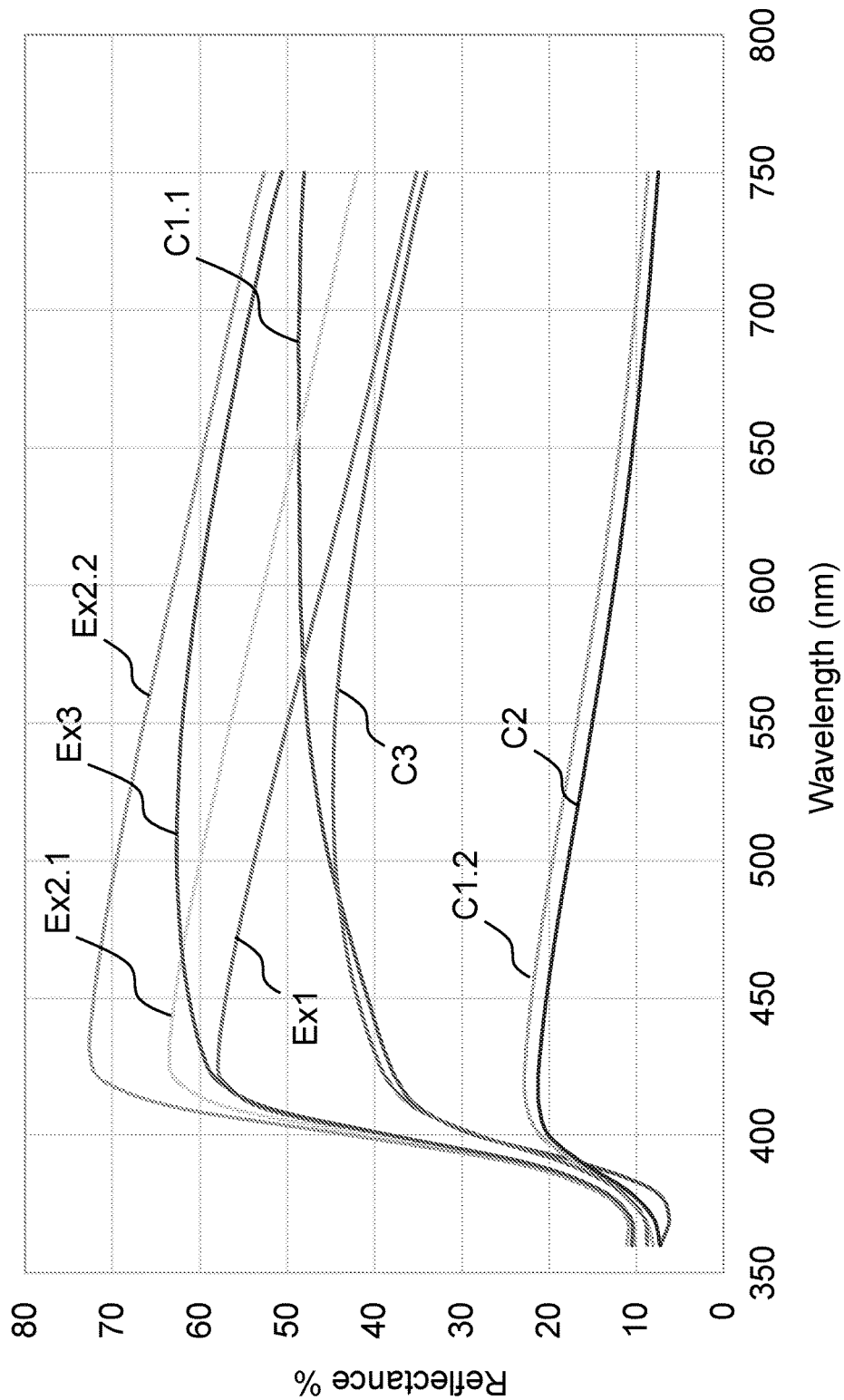
FIG. 1 is a graph showing reflectance as a function of wavelength for control and example compositions formed according to aspects of the disclosure.

The present disclosure can be understood more readily by reference to the following detailed description of the disclosure and the Examples included therein. In various aspects, the present disclosure pertains to laser plateable thermoplastic compositions including: (a) at least one high-heat base resin having a melt temperature (Tm) of at least 250° C.; at least 20 wt % of a reinforcing filler; (c) an LDS additive including a tin oxide, an antimony oxide, or a combination thereof; and (d) a reflection additive including a titanium compound. The composition has a reflectance of from about 50% to about 95% at a wavelength of from 400 nanometers (nm) to 750 nm in some aspects.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting.

Various combinations of elements of this disclosure are encompassed by this disclosure, e.g., combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

All publications mentioned herein are incorporated herein by reference to disclose and describe the methods and/or materials in connection with which the publications are cited.

Definitions

It is also to be understood that the terminology used herein is for the purpose of describing particular aspects only and is not intended to be limiting. As used in the specification and in the claims, the term "comprising" can include the aspects "consisting of" and "consisting essentially of" Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a reinforcing filler" includes mixtures of two or more reinforcing fillers.

As used herein, the term "combination" is inclusive of blends, mixtures, alloys, reaction products, and the like.

Ranges can be expressed herein as from one value (first value) to another value (second value). When such a range is expressed, the range includes in some aspects one or both of the first value and the second value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the designated value, approximately the designated value, or about the same as the designated value. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

References in the specification and concluding claims to parts by weight of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included.

As used herein, the terms "number average molecular weight" or "$M_n$" can be used interchangeably, and refer to the statistical average molecular weight of all the polymer chains in the sample and is defined by the formula:

$$M_n = \frac{\sum N_i M_i}{\sum N_i},$$

where $M_i$ is the molecular weight of a chain and $N_i$ is the number of chains of that molecular weight. $M_n$ can be determined for polymers, e.g., polycarbonate polymers, by methods well known to a person having ordinary skill in the art using molecular weight standards, e.g. polycarbonate standards or polystyrene standards, preferably certified or traceable molecular weight standards.

As used herein, the terms "weight average molecular weight" or "$M_w$" can be used interchangeably, and are defined by the formula:

$$M_w = \frac{\sum N_i M_i^2}{\sum N_i M_i},$$

where $M_i$ is the molecular weight of a chain and $N_i$ is the number of chains of that molecular weight. Compared to $M_n$, $M_w$ takes into account the molecular weight of a given chain in determining contributions to the molecular weight average. Thus, the greater the molecular weight of a given chain, the more the chain contributes to the $M_w$. $M_w$ can be determined for polymers, e.g., polycarbonate polymers, by methods well known to a person having ordinary skill in the art using molecular weight standards, e.g., polycarbonate standards or polystyrene standards, preferably certified or traceable molecular weight standards.

As used herein, the terms "polydispersity index" or "PDI" can be used interchangeably, and are defined by the formula:

$$PDI = \frac{M_w}{M_n}.$$

The PDI has a value equal to or greater than 1, but as the polymer chains approach uniform chain length, the PDI approaches unity.

The terms "BisA," "BPA," or "bisphenol A," which can be used interchangeably, as used herein refers to a compound having a structure represented by the formula:

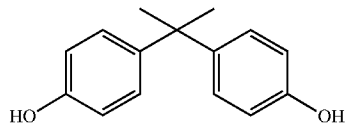 [SMILES: CC(C)(c1ccc(O)cc1)c1ccc(O)cc1]

BisA can also be referred to by the name 4,4'-(propane-2,2-diyl)diphenol; p,p'-isopropylidenebisphenol; or 2,2-bis(4-hydroxyphenyl)propane. BisA has the CAS #80-05-7.

As used herein, "polycarbonate" refers to an oligomer or polymer including residues of one or more dihydroxy compounds, e.g., dihydroxy aromatic compounds, joined by carbonate linkages; it also encompasses homopolycarbonates, copolycarbonates, and (co)polyester carbonates.

The terms "residues" and "structural units", used in reference to the constituents of the polymers, are synonymous throughout the specification.

As used herein the terms "weight percent," "%," and "wt. %," which can be used interchangeably, indicate the percent by weight of a given component based on the total weight of the composition, unless otherwise specified. That is, unless otherwise specified, all wt % values are based on the total weight of the composition. It should be understood that the sum of wt % values for all components in a disclosed composition or formulation are equal to 100.

Unless otherwise stated to the contrary herein, all test standards are the most recent standard in effect at the time of filing this application.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

Thermoplastic Compositions

The present disclosure relates to high-heat base resin LDS compositions that have high heat performance (identified by heat distortion temperature, HDT), good dielectric properties, and good color (reflectance or whiteness) properties. The thermoplastic compositions of the disclosure can be used in a wide range of circuit applications including LED circuits. In addition, they have good dielectric properties including high dielectric constant or relative permittivity (Dk) and low dissipation factor (Df), making them valuable for use in telecommunications applications, and in particular to 5G network applications.

Thermoplastic compositions according to aspects of the disclosure combine poly(cyclohexylenedimethylene terephthalate) (PCT) or other high-heat base resin(s), reinforcing fillers such as glass fiber, and LDS additives. The compositions are high heat solderable, laser plateable, and have good color (reflectance) properties.

In particular, the thermoplastic compositions according to aspects of the disclosure may include titanium, which can help maintain the high heat performance (HDT at 1.8 megapascals (MPa) greater that 200° C.) of the composition. In comparison, similar compositions that do not include titanium have an HDT of about 100° C. The titanium can be present in various forms, such as but not limited to titanium oxide or titanium oxide coated with an LDS additive. Further, the inclusion of titanium oxides can result in compositions having a higher Dk (e.g., 3.5~5) while maintaining a low Df (around 0.007).

Specific aspects of the disclosure relate to a thermoplastic composition including: (a) at least one high-heat base resin having a melt temperature (Tm) of at least 250 degrees Celsius (° C.); (b) at least 20 wt % of a reinforcing filler; (c) a laser direct structuring (LDS) additive including a tin oxide, an antimony oxide, or a combination thereof; and (d) a reflection additive including a titanium compound. The composition has a reflectance of from about 50% to about 95% at a wavelength of from 400 nanometers (nm) to 750 nm in some aspects. Reflectance may be determined according to ASTM D6290-98 in some aspects. Reflectance and color L*/a*/b* may be measured using a ColorEye 7000A available from GretagMacbeth, which measures reflectance from 360 nm to 750 nm wavelength intervals and which has the capability to take both specular and total transmission readings.

The high-heat base resin has a melt temperature (Tm) of at least 250° C. In some aspects the high-heat base resin has a Tm of from 250° C. to 350° C. Any polymer resin having this Tm property may be used in the composition. In some aspects the at least one high-heat resin includes, but is not limited to, poly(cyclohexylenedimethylene terephthalate) (PCT), polyphthalamide (PPA), copolymers thereof, or a combination thereof.

PCT is a high performance, semi-crystalline thermoplastic polyester produced by polycondensation of cyclohexane dimethanol (CHDM) and terephthalic acid (TPA). It generally has comparable mechanical properties as compared to polyethylene terephthalate (PET), including but not limited to flexural strength, impact strength and tensile strength (30% GF). Its resistance to hydrolysis and heat is superior. In addition, virgin PCT has a higher melting point (about 285° C.) than PET (about 245° C.). The PCT monomer is represented by the following formula, and has the CAS Reg. No. 25135-20-0:

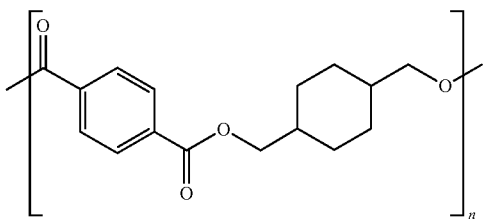

Exemplary PCT copolymers suitable for use in aspects of the disclosure include, but are not limited to, polyethylene terephthalate glycol (PETG), polycyclohexylene dimethylene terephthalate glycol (PCTG) and polycyclohexylene dimethylate terephthalate acid (PCTA). PETG and PCTG are copolyesters formed by including ethylene glycol (EG) in the polymerization reaction. PETG is formed if less than 50% of the diol content in the copolyester is CHDM; PCTG is formed if greater than 50% of the diol content in the copolyester is CHDM. PCTA is formed by including additional diacids such as isophthalic acid (IPA).

PPA is a semi-aromatic engineering thermoplastic including main building blocks of terephthalic acid or isophthalic acid (or a combination thereof) and at least one aliphatic diamine such as hexamethylene diamine. The PPA monomer is represented by the following formula:

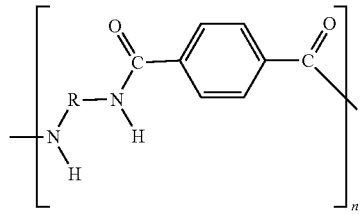

The aromatic acid portion comprises at least 55 molar percent of the repeat units in the polymer chain, PPA resins are only partially aromatic. PPA resin is characterized as having a melting point, rigidity, heat stability, and chemical resistance and a low moisture absorption. Example PPA compositions are disclosed in, e.g., U.S. Pat. No. 5,387,645, the disclosure of which is incorporated herein by this reference in its entirety.

The Tm of the high-heat base resin may be measured by differential scanning calorimetry (DSC). Equipment suitable for measuring DSC includes the Shimadzu DSC-60A. The measurement temperature range is about 80° C. to 400° C. with a heating or cooling rate of ±10-20° C./min. The sample can be in a form of a powder, pellet or part. A typical sample size is 20 mg.

In some aspects the tin oxide or the antimony oxide is in a form of a coating on an additional LDS additive. The additional LDS additive may be in some aspects a titanium compound. The titanium compound included in the additional LDS additive is in addition to the titanium compound in element (d) of the composition.

The composition includes in some aspects from about 2 wt % to about 20 wt % of the LDS additive. In particular aspects the composition includes from about 5 wt % to about 10 wt % of the LDS additive.

In further aspects the composition includes from about 5 wt % to about 50 wt % of the reflection additive including the titanium compound. In certain aspects the composition includes comprises from about 10 wt % to about 20 wt % of the reflection additive including the titanium compound.

In certain aspects the titanium compound of element (d) of the composition is titanium oxide, such as but not limited to titanium dioxide. Similarly, if included in the additional LDS additive (element (c)), the titanium compound may include titanium oxide, such as but not limited to titanium dioxide.

Exemplary reinforcing fillers suitable for use in thermoplastic compositions according to aspects of the disclosure include, but are not limited to, glass fiber, ceramic fiber, carbon fiber, a mineral filler, or a combination thereof. In particular aspects the reinforcing filler includes glass fiber. The composition includes at least 20 wt % of the reinforcing filler, or from 20 wt % to 70 wt % of the reinforcing filler in certain aspects.

The thermoplastic composition may include one or more additional additives in some aspects. The one or more additional additive may include, but is not limited to, an impact modifier, acid scavenger, anti-drip agent, antioxidant, antistatic agent, chain extender, colorant, de-molding agent, flow promoter, lubricant, mold release agent, plasticizer, quenching agent, flame retardant, UV reflecting additive, or a combination thereof. The at one or more additional additives may be included in the thermoplastic composition in any amount that will not significantly adversely affect the desired properties of the composition.

Thermoplastic compositions according to aspects of the disclosure have improved properties as compared to comparative compositions that do not include both a laser direct structuring (LDS) additive including a tin oxide, an antimony oxide, or a combination thereof (element (c)) and a reflection additive including a titanium compound (element (d)).

In particular, thermoplastic compositions according to aspects of the disclosure have a high heat distortion temperature (HDT). HDT may be evaluated according to ASTM D648 using a sample thickness of, for example 3.2 mm and a load of 0.45 or 1.82 megapascals (MPa). In certain aspects the composition has an HDT at 1.82 MPa of at least 200° C., or in further aspects of at least 250° C. In other aspects the composition has an HDT at 0.45 MPa of at least 200° C., or in further aspects of at least 250° C., or in yet further aspects 270° C.

In some aspects the composition has a dissipation factor (Df) less than 0.01. Df may be determined using an Agilent Split Post Dielectric Resonator at 1.1 gigahertz (GHz), 1.9 GHz, 5 GHz, 10 GHz, and/or 20 GHz. The method is referred to herein as the "SABIC Method."

The composition may have good color properties in some aspects. In particular, the composition may have an L* of at least 50 as determined in accordance with the CIE L*a*b* color space standard. In further aspects the composition has an L* of at least 70 as determined in accordance with the CIE L*a*b* color space standard, or in yet further aspects an L* of at least 80 to 95 as determined in accordance with the CIE L*a*b* color space standard.

In certain aspects the composition has a reflectance of from about 50% to about 95% at a wavelength of from 400 nm to 550 nm. In particular aspects the composition has a reflectance of from about 50% to about 95% at a wavelength of 450 nm. Reflectance may be evaluated according to the process described in the Examples herein.

Methods for Making the Thermoplastic Compositions

The one or any foregoing components described herein may be first dry blended with each other, or dry blended with any combination of foregoing components, then fed into an extruder from one or multi-feeders, or separately fed into an extruder from one or multi-feeders. Additional components such as additives or fillers may also be first processed into a masterbatch, then fed into an extruder. The components may be fed into the extruder from a throat hopper or any side feeders.

The extruders used in the disclosure may have a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, co-kneaders, disc-pack processors, various other types of extrusion equipment, or combinations including at least one of the foregoing.

The components may also be mixed together and then melt-blended to form the thermoplastic compositions. The melt blending of the components involves the use of shear force, extensional force, compressive force, ultrasonic energy, electromagnetic energy, thermal energy or combinations including at least one of the foregoing forces or forms of energy.

The barrel temperature on the extruder during compounding can be set at the temperature where at least a portion of the polymer has reached a temperature greater than or equal to about the melting temperature, if the resin is a semi-crystalline organic polymer, or the flow point (e.g., the glass transition temperature) if the resin is an amorphous resin.

The mixture including the foregoing mentioned components may be subject to multiple blending and forming steps if desirable. For example, the thermoplastic composition may first be extruded and formed into pellets. The pellets may then be fed into a molding machine where it may be formed into any desirable shape or product. Alternatively, the thermoplastic composition emanating from a single melt blender may be formed into sheets or strands and subjected to post-extrusion processes such as annealing, uniaxial or biaxial orientation.

The temperature of the melt in the present process may in some aspects be maintained as low as possible in order to avoid excessive thermal degradation of the components. In some aspects the melt processed composition exits processing equipment such as an extruder through small exit holes in a die. The resulting strands of molten resin may be cooled by passing the strands through a water bath. The cooled strands can be chopped into pellets for packaging and further handling. Exemplary conditions for making thermoplastic compositions according to aspects of the disclosure are set forth in the examples below.

Articles of Manufacture

In certain aspects, the present disclosure pertains to shaped, formed, or molded articles including the thermoplastic compositions. The thermoplastic compositions can be molded into useful shaped articles by a variety of means such as injection molding, extrusion, rotational molding, blow molding and thermoforming to form articles and structural components of, for example, personal or commercial electronics devices, including but not limited to cellular telephones, tablet computers, personal computers, notebook and portable computers, and other such equipment, medical applications, RFID applications, automotive applications, and the like. In a further aspect, the article is extrusion molded. In a still further aspect, the article is injection molded.

In particular aspects the article is a component of a light emitting diode (LED) or a component of a 5G network telecommunications device.

Various combinations of elements of this disclosure are encompassed by this disclosure, e.g., combinations of elements from dependent claims that depend upon the same independent claim.

Aspects of the Disclosure

In various aspects, the present disclosure pertains to and includes at least the following aspects.

Aspect 1: A thermoplastic composition comprising, consisting of, or consisting essentially of:
(a) at least one high-heat base resin having a melt temperature (Tm) of at least 250 degrees Celsius (° C.), or from 250° C. to 350° C.;
(b) at least 20 wt % of a reinforcing filler;
(c) a laser direct structuring (LDS) additive comprising a tin oxide, an antimony oxide, or a combination thereof; and
(d) a reflection additive comprising a titanium compound.

Aspect 2. The thermoplastic composition according to Aspect 1, wherein the tin oxide or the antimony oxide is in a form of a coating on an additional LDS additive.

Aspect 3. The thermoplastic composition according to Aspect 2, wherein the additional LDS additive is a titanium compound.

Aspect 4. The thermoplastic composition according to Aspect 3, wherein the titanium compound comprises titanium oxide.

Aspect 5. The thermoplastic composition according to any of Aspects 1 to 4, wherein the at least one high-heat resin comprises poly(cyclohexylenedimethylene terephthalate) (PCT), polyphthalamide (PPA), copolymers thereof, or a combination thereof.

Aspect 6. The thermoplastic composition according to any of Aspects 1 to 5, wherein the composition comprises from about 2 wt % to about 20 wt % of the LDS additive.

Aspect 7. The thermoplastic composition according to any of Aspects 1 to 6, wherein the composition comprises from about 5 wt % to about 50 wt % of the reflection additive comprising the titanium compound.

Aspect 8. The thermoplastic composition according to Aspect 7, wherein the composition comprises from about 10 wt % to about 20 wt % of the reflection additive comprising the titanium compound.

Aspect 9. The thermoplastic composition according to any of Aspects 1 to 8, wherein the reinforcing filler comprises glass fiber, ceramic fiber, carbon fiber, a mineral filler, or a combination thereof.

Aspect 10. The thermoplastic composition according to Aspect 9, wherein the reinforcing filler comprises glass fiber.

Aspect 11. The thermoplastic composition according to any of Aspects 1 to 10, wherein the composition has a heat distortion temperature (HDT) at 1.82 megapascals (MPa) of at least 200° C.

Aspect 12. The thermoplastic composition according to any of Aspects 1 to 11, wherein the composition has a heat distortion temperature (HDT) at 1.82 megapascals (MPa) of at least 250° C.

Aspect 13. The thermoplastic composition according to any of Aspects 1 to 12, wherein the composition has a HDT at 0.45 MPa of at least 200° C.

Aspect 14. The thermoplastic composition according to any of Aspects 1 to 13, wherein the composition has a HDT at 0.45 MPa of at least 250° C.

Aspect 15. The thermoplastic composition according to any of Aspects 1 to 13, wherein the composition has a HDT at 0.45 MPa of at least 270° C.

Aspect 16. The thermoplastic composition according to any of Aspects 1 to 15, wherein the composition has a dissipation factor (Df) less than 0.01.

Aspect 17. The thermoplastic composition according to any of Aspects 1 to 16, wherein the composition has an L* of at least 50 as determined in accordance with the CIE L*a*b* color space standard.

Aspect 18. The thermoplastic composition according to any of Aspects 1 to 17, wherein the composition has an L* of at least 70 as determined in accordance with the CIE L*a*b* color space standard.

Aspect 19. The thermoplastic composition according to any of Aspects 1 to 18, wherein the composition has an L* of at least 80 to 95 as determined in accordance with the CIE L*a*b* color space standard.

Aspect 20. The thermoplastic composition according to any of Aspects 1 to 19, wherein the composition has a reflectance of from about 50% to about 95% at a wavelength of from 400 nanometers (nm) to 750 nm Aspect 21. The thermoplastic composition according to any of Aspects 1 to 20, wherein the composition has a reflectance of from about 50% to about 95% at a wavelength of from 400 nm to 550 nm.

Aspect 22. The thermoplastic composition according to any of Aspects 1 to 21, wherein the composition has a reflectance of from about 50% to about 95% at a wavelength of 450 nm.

Aspect 23. The thermoplastic composition according to any of Aspects 1 to 22, wherein the composition further comprises one or more additional additives.

Aspect 24. Thermoplastic composition according to Aspect 23, wherein the one or more additional additives comprises an impact modifier, acid scavenger, anti-drip agent, antioxidant, antistatic agent, chain extender, colorant, de-molding agent, flow promoter, lubricant, mold release agent, plasticizer, quenching agent, flame retardant, UV reflecting additive, or a combination thereof.

Aspect 25. An article comprising the thermoplastic composition according to any of Aspects 1 to 24.

Aspect 26. The article according to Aspect 25, wherein the article is a component of a light emitting diode (LED) or a component of a 5G network telecommunications device.

Aspect 27. A thermoplastic composition comprising, consisting of, or consisting essentially of:
(a) poly(cyclohexylenedimethylene terephthalate) (PCT) or a copolymer thereof;
(b) at least 10 wt % of a reinforcing filler comprising glass fiber;
(c) a laser direct structuring (LDS) additive comprising a tin oxide, an antimony oxide, or a combination thereof; and
(d) a reflection additive comprising a titanium compound, wherein
(1) a weight ratio of total titanium in the composition to the LDS additive in the composition is at least 0.7:1; or
(2) a weight ratio of total titanium in the composition to the PCT is 1.1:1 or less. In some aspects the ratio of titanium to LDS additive is at least 1:1, at least 2:1, at least 4:1, at least 6:1, or greater than 6:1.

Aspect 28. The thermoplastic composition according to Aspect 27, wherein the tin oxide or the antimony oxide is in a form of a coating on an additional LDS additive.

Aspect 29. The thermoplastic composition according to Aspect 28, wherein the additional LDS additive comprises a titanium oxide.

Aspect 30. The thermoplastic composition according to any of Aspects 27 to 29, wherein the composition further comprises a thermally conductive filler different than the reinforcing filler in element (b).

Aspect 31. The thermoplastic composition according to Aspect 30, wherein the thermally conductive filler comprises boron nitride Aspect 32. The thermoplastic composition according to any of Aspects 27 to 31, wherein the composition comprises from about 2 wt % to about 20 wt % of the LDS additive.

Aspect 33. The thermoplastic composition according to any of Aspects 27 to 32, wherein the composition comprises from about 5 wt % to about 50 wt % of the reflection additive comprising the titanium compound.

Aspect 34. The thermoplastic composition according to Aspect 33, wherein the composition comprises from about 10 wt % to about 20 wt % of the reflection additive comprising the titanium compound.

Aspect 35. The thermoplastic composition according to any of Aspects 27 to 34, wherein the reinforcing filler comprises glass fiber, ceramic fiber, carbon fiber, a mineral filler, or a combination thereof.

Aspect 36. The thermoplastic composition according to any of Aspects 27 to 35, wherein the composition has a heat distortion temperature (HDT) at 1.82 megapascals (MPa) and a sample thickness of 3.2 millimeters (mm) of at least 200° C., or a HDT at 0.45 MPa and a sample thickness of 3.2 mm of at least 200° C. In further aspects the composition has a heat distortion temperature (HDT) at 1.82 megapascals (MPa) and a sample thickness of 3.2 millimeters (mm) of at least 220° C.

Aspect 37. The thermoplastic composition according to any of Aspects 27 to 36, wherein the composition has a dissipation factor (Df) less than 0.01.

Aspect 38. The thermoplastic composition according to any of Aspects 27 to 37, wherein the composition has an L* of at least 70 as determined in accordance with the CIE L*a*b* color space standard. In further aspects the composition has an L* of at least 75, or at least 80, or at least 85, as determined in accordance with the CIE L*a*b* color space standard Aspect 39. The thermoplastic composition according to any of Aspects 27 to 38, wherein the composition has a reflectance of from about 50% to about 95% at a wavelength of from 400 nanometers (nm) to 750 nm. In further aspects the composition has a reflectance of from about 60% to about 95%, or from about 70% to about 95%, or from about 80% to about 95%, or greater than 50%, or greater than 60%, or greater than 70%, or greater than 80%, at a wavelength of from 400 nanometers (nm) to 750 nm Aspect 40. The thermoplastic composition according to any of Aspects 27 to 39, wherein the composition has an in-plane thermal conductivity of at least 0.5 watts per meter Kelvin (W/(m·K)), or a through-plane thermal conductivity of at least 0.5 W/(m·K). In further aspects the composition has an in-plane thermal conductivity of at least 1.0 W/(m·K).

Aspect 41. The thermoplastic composition according to any of Aspects 27 to 40, wherein the composition further comprises one or more additional additives.

Aspect 42. Thermoplastic composition according to Aspect 41 wherein the one or more additional additives comprises an impact modifier, acid scavenger, anti-drip agent, antioxidant, antistatic agent, chain extender, colorant, de-molding agent, flow promoter, lubricant, mold release agent, plasticizer, quenching agent, flame retardant, UV reflecting additive, or a combination thereof.

Aspect 43. An article comprising the thermoplastic composition according to any of Aspects 27 to 42, wherein the article is a component of a light emitting diode (LED) or a component of a 5G network telecommunications device.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt %.

There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

Example 1

Control and Example compositions were prepared in accordance with Tables 1A and 1B:

TABLE 1A

Example and Control Compositions

| Component (in wt %) | C1.1 | C1.2 | Ex1 |
|---|---|---|---|
| PCT (Grade 13787, Eastman Chemical) | 69.3 | 59.3 | 49.3 |
| Hindered phenol stabilizer | 0.1 | 0.1 | 0.1 |
| Pentaerythritol tetrastearate (PETS) | 0.2 | 0.2 | 0.2 |
| Phosphite stabilizer | 0.2 | 0.2 | 0.2 |
| UV stabilizer, 2-(2'hydroxy-5-t-octylphenyl)-benzotriazole | 0.2 | 0.2 | 0.2 |
| Terpolymer impact modifier | | | |
| Flat glass fiber, PA830, Nittobo (reinforcing filler) | 30 | 30 | 30 |
| Tin-antimony cassiterite gray (Ferro) (LDS additive) | | 10 | 10 |
| $TiO_2$ coated with $(Sn/Sb)O_2$ (Grade 8850, Ferro) | | | |
| Coated $TiO_2$ (Kronos K2233) | | | 10 |
| Total: | 100 | 100 | 100 |

TABLE 1B

Example and Control Compositions

| Component (in wt %) | C2 | Ex2.1 | Ex2.2 | C3 | Ex3 |
|---|---|---|---|---|---|
| PCT (Grade 13787, Eastman Chemical) | 64.3 | 54.3 | 44.3 | 61.8 | 51.8 |
| Hindered phenol stabilizer | 0.1 | 0.1 | 0.1 | 0.1 | 0.1 |
| Pentaerythritol tetrastearate (PETS) | 0.2 | 0.2 | 0.2 | 0.2 | 0.2 |
| Phosphite stabilizer | 0.2 | 0.2 | 0.2 | 0.2 | 0.2 |
| UV stabilizer, 2-(2'hydroxy-5-t-octylphenyl)-benzotriazole | 0.2 | 0.2 | 0.2 | 0.2 | 0.2 |
| Terpolymer impact modifier | | | | | |
| Flat glass fiber, PA830, Nittobo (reinforcing filler) | 30 | 30 | 30 | 30 | 30 |
| Tin-antimony cassiterite gray (Ferro) (LDS additive) | 5 | 5 | 5 | | |
| $TiO_2$ coated with $(Sn/Sb)O_2$ (Grade 8850, Ferro) | | | | 7.5 | 7.5 |
| Coated $TiO_2$ (Kronos K2233) | | 10 | 20 | | 10 |
| Total: | 100 | 100 | 100 | 100 | 100 |

The properties of the compositions in Tables 1A and 1B were determined in accordance and are reported in Tables 1C and 1D, respectively:

TABLE 1C

Properties of Table 1A Compositions

| | Test Standard/Description | Unit | C1.1 | C1.2 | Ex1 |
|---|---|---|---|---|---|
| Ash | ASTM D5630, 10 g of sample ashed at 800° C. | % | 29.5 | 39.1 | 48.4 |
| Specific Gravity | ASTM D792 | g/cm³ | 1.4 | 1.6 | 1.7 |
| MVR | ASTM D1238, 300° C., 1.2 kg, 300 s | cm3/10 min | 32.2 | 15.8 | 18.7 |
| HDT | ASTM D648, 0.45 MPa, 3.2 mm | ° C. | 280 | 269 | 275 |
| HDT | ASTM D648, 1.82 MPa, 3.2 mm | ° C. | 261 | 105 | 231 |
| Flexural Modulus | ASTM D790, 3.2 mm, 1.27 mm/min | MPa | 7820 | 7740 | 8680 |
| Flexural Strength | ASTM D790, yield, 3.2 mm, 1.27 mm/min | MPa | 159 | 141 | 133 |
| Tensile Modulus | ASTM D638, 5 mm/min | MPa | 8690 | 8631 | 9799 |
| Tensile Strength | ASTM D638, break, 5 mm/min | MPa | 97 | 81 | 77 |
| Tensile Elongation | ASTM D638, break, 5 mm/min | % | 2.0 | 1.2 | 1.2 |
| Notched IZOD | ASTM D256, 23° C., 2 lbf/ft | J/m | 92 | 48 | 44 |

TABLE 1C-continued

Properties of Table 1A Compositions

|  | Test Standard/Description | Unit | C1.1 | C1.2 | Ex1 |
|---|---|---|---|---|---|
| Unnotched IZOD | ASTM D256, 23° C., 5 lbf/ft | J/m | 531 | 411 | 335 |
| Dk | SABIC Method, 1.1 GHz |  | 3.353 | 3.723 | 4.270 |
| Df | SABIC Method, 1.1 GHz |  | 0.007 | 0.008 | 0.007 |
| Dk | SABIC Method, 1.9 GHz |  | 3.357 | 3.813 | 4.280 |
| Df | SABIC Method, 1.9 GHz |  | 0.007 | 0.008 | 0.007 |
| Dk | SABIC Method, 5 GHz |  | 3.363 | 3.753 | 4.257 |
| Df | SABIC Method, 5 GHz |  | 0.007 | 0.007 | 0.007 |
| Reflectance | ASTM D6290-98 | 450 nm | 41 | 22 | 57 |
| L* |  |  | 74.2 | 48.0 | 76.0 |
| a* |  |  | −0.9 | −3.8 | −3.1 |
| b* |  |  | 7.2 | −9.9 | −6.7 |

TABLE 1D

Properties of Table 1B Compositions

|  | Test Standard/Description | Unit | C2 | Ex2.1 | Ex2.2 | C3 | Ex3 |
|---|---|---|---|---|---|---|---|
| Ash | ASTM D5630, 10 g of sample ashed at 800° C. | % | 34.9 | 44.9 | 53.7 | 36.1 | 45.8 |
| Specific Gravity | ASTM D792 | g/cm³ | 1.5 | 1.7 | 1.8 | 1.5 | 1.7 |
| MVR | ASTM D1238, 300° C., 1.2 kg, 300 s | cm3/10 min | 15.3 | 19.1 | 24.8 | 22.1 | 35.1 |
| HDT | ASTM D648, 0.45 MPa, 3.2 mm | ° C. | 272 | 272 | 275 | 276 | 278 |
| HDT | ASTM D648, 1.82 MPa, 3.2 mm | ° C. | 106 | 200 | 227 | 244 | 239 |
| Flexural Modulus | ASTM D790, 3.2 mm, 1.27 mm/min | MPa | 7420 | 8250 | 9800 | 8070 | 8910 |
| Flexural Strength | ASTM D790, yield, 3.2 mm, 1.27 mm/min | MPa | 135 | 126 | 124 | 135 | 120 |
| Tensile Modulus | ASTM D638, 5 mm/min | MPa | 8222 | 9266 | 11091 | 8921 | 10048 |
| Tensile Strength | ASTM D638, break, 5 mm/min | MPa | 76 | 78 | 72 | 80 | 68 |
| Tensile Elongation | ASTM D638, break, 5 mm/min | % | 1.2 | 1.2 | 1.1 | 1.2 | 1.0 |
| Notched IZOD | ASTM D256, 23° C. 2 lbf/ft | J/m | 50 | 46 | 44 | 49 | 47 |
| Unnotched IZOD | ASTM D256, 23° C., 5 lbf/ft | J/m | 375 | 333 | 281 | 331 | 274 |
| Dk | SABIC Method, 1.1 GHz |  | 3.560 | 4.060 |  | 3.693 | 4.230 |
| Df | SABIC Method, 1.1 GHz |  | 0.008 | 0.007 |  | 0.007 | 0.007 |
| Dk | SABIC Method, 1.9 GHz |  | 3.627 | 4.113 | 4.653 | 3.713 | 4.300 |
| Df | SABIC Method, 1.9 GHz |  | 0.008 | 0.007 | 0.007 | 0.008 | 0.008 |
| Dk | SABIC Method, 5 GHz |  | 3.593 | 4.110 | 4.697 | 3.690 | 4.353 |
| Df | SABIC Method, 5 GHz |  | 0.007 | 0.007 | 0.007 | 0.007 | 0.008 |
| Reflectance | ASTM D6290-98 | 450 nm | 20 | 63 | 72 | 42 | 61 |
| L* |  |  | 45.7 | 79.8 | 85.1 | 72.1 | 82.6 |
| a* |  |  | −3.8 | −2.9 | −2.5 | −3.2 | −2.6 |
| b* |  |  | −10.7 | −5.5 | −4.3 | 2.5 | 0.7 |

Reflectance data for the compositions at 450 nanometers (nm) is shown above. A curve of % reflectance vs. wavelength for the samples is provided in FIG. 1. From the data it is observed that the reflectance of the composition changed with wavelength. Overall, the control compositions (C1.1, C1.2, C2 and C3) failed to exceed 50% reflectance at any wavelength. Control composition C1.1 achieved the highest reflectance, approaching but not reaching 50% at the higher wavelengths of 650-700 nm.

It was further observed that adding an LDS additive to the composition resulted in a loss of reflectance across all wavelengths (see, e.g., C1.2 and C2), demonstrating the problem and challenge to generate an LDS compound combined with a high reflectance property. Compositions including particular LDS additives (for example coated $TiO_2$, control composition C3) can mitigate the reduction in reflectance, but reflectance is still relatively low.

By increasing the titanium content even further (see example compositions Ex1, Ex2.1, Ex2.2, Ex3), reflectance was increased to over 50% across most wavelengths. Further, at wavelengths between 400 nm and 550 nm (including the conventional LED industry requirement of 450 nm), the reflectance of the example compositions was exceptionally high.

Reflectance can be determined according to conventional methods and using conventional equipment. The reflectance data described herein and shown in FIG. 1 was measured using a GretagMacbeth Color-Eye® 7000A at wavelength intervals from 360 to 750 nm. Reflectance may also be measured using a Shimadzu UV-3150 spectrophotometer at wavelengths of from 200 to 800 nm.

Example 2

Control and Example compositions were prepared in accordance with Table 2A; properties of the compositions are shown in Table 2B:

TABLE 2A

Example and Control Compositions

| Component (in wt %) | C2.1 | C2.2 | Ex2.1 | Ex2.2 | Ex2.3 |
|---|---|---|---|---|---|
| PCT (Grade 13787, Eastman Chemical) | 69.3 | 59.3 | 49.3 | 61.8 | 51.8 |
| Hindered phenol stabilizer | 0.1 | 0.1 | 0.1 | 0.1 | 0.1 |
| Pentaerythritol tetrastearate (PETS) | 0.2 | 0.2 | 0.2 | 0.2 | 0.2 |
| Phosphite stabilizer | 0.2 | 0.2 | 0.2 | 0.2 | 0.2 |
| UV stabilizer, 2-(2'hydroxy-5-t-octylphenyl)-benzotriazole | 0.2 | 0.2 | 0.2 | 0.2 | 0.2 |
| Flat glass fiber, PA830, Nittobo (reinforcing filler) | 30 | 30 | 30 | 30 | 30 |
| Tin-antimony cassiterite gray (Ferro) (LDS additive) | | 10 | 10 | | |
| TiO2 coated with (Sn/Sb)O$_2$ (Grade 8850, Ferro) | | | | 7.5 | 7.5 |
| Coated TiO$_2$ (Kronos K2233) | | 10 | | | 10 |
| Total: | 100 | 100 | 100 | 100 | 100 |

The data in Example 2 shows that tin-antimony based LDS additive is very effective for LDS plating properties (see FIG. 2). However, PCT is a crystalline polymer of which the crystallinity is difficult to maintain. By introducing metallic additive such as tin-antimony LDS additive in a glass-filled PCT system, the crystallinity and therefore HDT is significantly reduced (by comparing C2.1 to C2.2), in particular the HDT at higher pressure such as 1.8 MPa, which decreased to around 100° C.

By introducing titanium oxide according to aspects of the disclosure it was found that HDT can be maintained at a high level (Ex2.1), likely above 200° C. at high pressure, and above 250° C. at low pressure. Such compositions are suitable for use in soldering applications.

The combination of LDS additive and titanium oxide may be used in various amounts and types (Ex2.1, Ex2.2, Ex2.3). Suitable combinations include tin or tin-antimony oxide and titanium oxide such as in Ex2.1. The combination may further be a pre-synthesized or pre-blended chemical such as titanium oxide coated tin or tin-antimony oxide (Ex2.2). The combination may further be a combination of these (Ex2.3).

Example 3

Control and Example compositions were prepared in accordance with Table 3A; properties of the compositions are shown in Table 3B:

TABLE 2B

Properties of Table 2A Compositions

| | Test Standard/Description | Unit | C2.1 | C2.2 | Ex2.1 | Ex2.2 | Ex2.3 |
|---|---|---|---|---|---|---|---|
| Specific Gravity | ASTM D792 | g/cm$^3$ | 1.4 | 1.6 | 1.7 | 1.5 | 1.7 |
| MVR | ASTM D1238, 300° C. 1.2 kg, 300 s | cm3/10 min | 32 | 16 | 19 | 22 | 35 |
| HDT | ASTM D648, 0.45 MPa, 3.2 mm | ° C. | 280 | 269 | 275 | 276 | 278 |
| HDT | ASTM D648, 1.82 MPa, 3.2 mm | ° C. | 261 | 105 | 231 | 244 | 239 |
| Flexural Modulus | ASTM D790, 3.2 mm, 1.27 mm/min | MPa | 7820 | 7740 | 8680 | 8070 | 8910 |
| Flexural Strength | ASTM D790, yield, 3.2 mm, 1.27 mm/min | MPa | 159 | 141 | 133 | 135 | 120 |
| Tensile Modulus | ASTM D638, 5 mm/min | MPa | 8690 | 8631 | 9799 | 8921 | 10048 |
| Tensile Strength | ASTM D638, break, 5 mm/min | MPa | 97 | 81 | 77 | 80 | 68 |
| Tensile Elongation | ASTM D638, break, 5 mm/min | % | 2.0 | 1.2 | 1.2 | 1.2 | 1.0 |
| Notched IZOD | ASTM D256, 23° C., 2 lbf/ft | J/m | 92 | 48 | 44 | 49 | 47 |
| Unnotched IZOD | ASTM D256, 23° C., 5 lbf/ft | J/m | 531 | 411 | 335 | 331 | 274 |
| Dk | SABIC Method, 1.1 GHz | | 3.353 | 3.723 | 4.270 | 3.693 | 4.230 |
| Df | SABIC Method, 1.1 GHz | | 0.007 | 0.008 | 0.007 | 0.007 | 0.007 |
| Dk | SABIC Method, 1.9 GHz | | 3.357 | 3.813 | 4.280 | 3.713 | 4.300 |
| Df | SABIC Method, 1.9 GHz | | 0.007 | 0.008 | 0.007 | 0.008 | 0.008 |
| Dk | SABIC Method, 5 GHz | | 3.363 | 3.753 | 4.257 | 3.690 | 4.353 |
| Df | SABIC Method, 5 GHz | | 0.007 | 0.007 | 0.007 | 0.007 | 0.008 |
| Reflectance | ASTM D6290-98 | 450 nm | 41 | 22 | 57 | 42 | 61 |
| L* | | | 74.2 | 48.0 | 76.0 | 72.1 | 82.6 |
| a* | | | -0.9 | -3.8 | -3.1 | -3.2 | -2.6 |
| b* | | | 7.2 | -9.9 | -6.7 | 2.5 | 0.7 |
| LDS plating index | | | 0 | 0.7 | 1.2 | 0.7 | 1.0 |

TABLE 3A

Example and Control Compositions

| Component (in wt %) | C3 | Ex3.1 | Ex3.2 | Ex3.3 | Ex3.4 | Ex3.5 |
|---|---|---|---|---|---|---|
| PCT (Grade 13787, Eastman Chemical) | 64.3 | 54.3 | 44.3 | | | |
| PCT (SKYPURA 3302, SK Chemicals) | | | | 34.3 | 44.3 | |
| PCT (SKYPURA 3502, SK Chemicals) | | | | | | 39.3 |
| Hindered phenol stabilizer | 0.1 | 0.1 | 0.1 | 0.1 | 0.1 | 0.1 |
| Pentaerythritol tetrastearate (PETS) | 0.2 | 0.2 | 0.2 | 0.2 | 0.2 | 0.2 |
| Phosphite stabilizer | 0.2 | 0.2 | 0.2 | 0.2 | 0.2 | 0.2 |
| UV stabilizer, 2-(2'hydroxy-5-t-octylphenyl)-benzotriazole | 0.2 | 0.2 | 0.2 | 0.2 | 0.2 | 0.2 |
| Flat glass fiber, PA830, Nittobo (reinforcing filler) | 30 | 30 | 30 | 30 | 20 | 20 |
| Tin-antimony cassiterite gray (Ferro) (LDS additive) | 5 | 5 | 5 | 5 | 5 | |
| Antimony oxide (LDS additive) | | | | | | 20 |
| Coated $TiO_2$ (Kronos K2233) | | 10 | 20 | 30 | 30 | 20 |
| Total: | 100 | 100 | 100 | 100 | 100 | 100 |

TABLE 3B

Properties of Table 3A Compositions

| | Test Standard/Description | Unit | C3 | Ex3.1 | Ex3.2 | Ex3.3 | Ex3.4 | Ex3.5 |
|---|---|---|---|---|---|---|---|---|
| HDT | ASTM D648, 0.45 MPa, 3.2 mm | ° C. | 272 | 272 | 275 | 273 | 266 | 273 |
| HDT | ASTM D648, 1.82 MPa, 3.2 mm | ° C. | 106 | 200 | 227 | 235 | 211 | 236 |
| Flexural Modulus | ASTM D790, 3.2 mm, 1.27 mm/min | MPa | 7420 | 8250 | 9800 | 10800 | 7490 | 7340 |
| Flexural Strength | ASTM D790, yield, 3.2 mm, 1.27 mm/min | MPa | 135 | 126 | 124 | 143 | 114 | 105 |
| Tensile Modulus | ASTM D638, 5 mm/min | MPa | 8222 | 9266 | 11091 | 12006 | 8525 | 8198 |
| Tensile Strength | ASTM D638, break, 5 mm/min | MPa | 76 | 78 | 72 | 85 | 63 | 68 |
| Tensile Elongation | ASTM D638, break, 5 mm/min | % | 1.2 | 1.2 | 1.1 | 1.5 | 1.2 | 1.6 |
| Notched IZOD | ASTM D256, 23 ° C., 2 lbf/ft | J/m | 50 | 46 | 44 | 41 | 40 | 42 |
| Unnotched IZOD | ASTM D256, 23 ° C., 5 lbf/ft | J/m | 375 | 333 | 281 | 275 | 268 | 268 |
| Dk | SABIC Method, 1.1 GHz | | | 3.560 | 4.060 | — | 5.807 | 5.250 | 4.703 |
| Df | SABIC Method, 1.1 GHz | | | 0.008 | 0.007 | — | 0.007 | 0.007 | 0.006 |
| Dk | SABIC Method, 1.9 GHz | | | 3.627 | 4.113 | 4.653 | 5.897 | 5.230 | 4.797 |
| Df | SABIC Method, 1.9 GHz | | | 0.008 | 0.007 | 0.007 | 0.007 | 0.007 | 0.007 |
| Dk | SABIC Method, 5 GHz | | | 3.593 | 4.110 | 4.697 | 5.753 | 5.100 | 4.703 |
| Df | SABIC Method, 5 GHz | | | 0.007 | 0.007 | 0.007 | 0.007 | 0.006 | 0.006 |
| Reflectance | ASTM D6290-98 | 450 nm | 20 | 63 | 72 | 80 | 80 | 70 |
| L* | | | 46 | 80 | 85 | 86 | 87 | 84 |
| LDS plating index | | | 0.5 | 1.0 | 1.2 | 1.2 | 1.2 | 1.2 |

Images of plaques of several of these LDS-plated compositions are shown in FIG. 3. The data of Example 3 combined with some data from Example 2, demonstrates the effect of the ratio of titanium to LDS additive on the heat resistance properties of the PCT composition. Ex2.1 includes 10 wt % titanium oxide and 10 wt % LDS (i.e., a ratio of titanium:LDS of 1:1) and has good heat resistance properties, demonstrating that this ratio is suitable.

Ex2.2 includes an LDS additive including $TiO_2$ coated with $(Sn/Sb)O_2$. This additive includes from about 45-65% titanium and about 35-55% $(Sn/Sb)O_2$, providing a ratio of titanium to LDS additive of about 0.8 to 1.9. This range of the titanium:LDS additive ratio also provides good heat resistance properties to the composition. Based on these examples, a lower limit of titanium:LDS additive is 0.7:1 is suitable.

Ex3.1, Ex3.2 and Ex3.3 demonstrate that there is no upper limitation on the ratio of titanium to LDS additive. The titanium oxide content can be as high as—and not necessarily limited to—30 wt %. The LDS additive content can be as low as 5 wt % or as high as—but not necessarily limited to—20 wt %. Thus, the ratio of titanium to LDS additive may be 1:1, 2:1, 4:1, 6:1 or even higher. In each of the compositions the heat resistance properties of PCT composition are maintained.

Further, there is not necessarily an upper limitation on the glass fiber content. Examples with glass fiber content greater than 20% are provided. Moreover, the type of PCT does not affect the properties of the composition; see Ex3.3, Ex3.4 and Ex3.5.

Example 4

Control and Example compositions were prepared in accordance with Table 4A; properties of the compositions are shown in Table 4B:

TABLE 4A

Example and Control Compositions

| Component (in wt %) | C4 | Ex4 |
|---|---|---|
| PCT (SKYPURA 3302, SK Chemicals) | 34.3 | |
| PCT (SKYPURA 1631, SK Chemicals) | | 34.3 |
| Hindered phenol stabilizer | 0.1 | 0.1 |
| Pentaerythritol tetrastearate (PETS) | 0.2 | 0.2 |
| Phosphite stabilizer | 0.2 | 0.2 |

TABLE 4A-continued

Example and Control Compositions

| Component (in wt %) | C4 | Ex4 |
|---|---|---|
| UV stabilizer, 2-(2'hydroxy-5-t-octylphenyl)-benzotriazole | 0.2 | 0.2 |
| Flat glass fiber, PA830, Nittobo (reinforcing filler) | 20 | 20 |
| Tin-antimony cassiterite gray (Ferro) (LDS additive) | 5 | 5 |
| Coated TiO$_2$ (Kronos K2233) | 40 | 30 |
| Boron Nitride BNHN (Thermal conductive 10 μm, Dandong Chemicals) |  | 10 |
| Total: | 100 | 100 |

TABLE 4B

Properties of Table 4A Compositions

| | Test Standard/Description | Unit | C4 | Ex4 |
|---|---|---|---|---|
| HDT | ASTM D648, 0.45 MPa, 3.2 mm | ° C. | 260 | 249 |
| HDT | ASTM D648, 1.82 MPa, 3.2 mm | ° C. | 96 | 204 |
| Flexural Modulus | ASTM D790, 3.2 mm, 1.27 mm/min | MPa | 8660 | 11900 |
| Flexural Strength | ASTM D790, yield, 3.2 mm, 1.27 mm/min | MPa | 116 | 122 |
| Tensile Modulus | ASTM D638, 5 mm/min | MPa | 9585 | 12845 |
| Tensile Strength | ASTM D638, break, 5 mm/min | MPa | 67 | 77 |
| Tensile Elongation | ASTM D638, break, 5 mm/min | % | 1.3 | 1.0 |
| Notched IZOD | ASTM D256, 23° C., 2 lbf/ft | J/m | 41 | 33 |
| Unnotched IZOD | ASTM D256, 23° C., 5 lbf/ft | J/m | 329 | 171 |
| Dk | SABIC Method, 1.1 GHz | | 6.253 | 5.817 |
| Df | SABIC Method, 1.1 GHz | | 0.007 | 0.006 |
| Reflectance | 450 nm | % | 78 | 77 |
| L* | | | 88 | 87 |
| Thermal conductivity | In plane | | — | 1.9 |
| Thermal conductivity | Through plane | | 0.5 | 0.9 |

The data in Example 4 further demonstrates the effect of the ratio titanium to PCT on the properties of the composition. In comparative example C4, titanium oxide is 40 wt % and PCT is 34.3 wt %. The ratio of titanium:PCT is thus 1.2:1. The heat resistance of this composition is very low, in particular at higher pressure 1.8 MPa, where HDT dropped 100° C. Although the composition has a high whiteness (L value), this composition would no longer be suitable for soldering applications. In comparison to Example 3 (Ex3.3 and Ex3.4), maintaining the ratio of titanium to PCT below 1.2 maintains the heat resistance properties of the PCT composition.

In addition, this ratio is acceptable when an additional component such as a thermally conductive filler is added (Ex4). By minimizing the ratio of titanium to PCT less than 1:1 and replacing 10 wt % titanium with 10% of a thermally conductive filler (e.g., boron nitride), there is minimal reduction of whiteness and reflectance, the heat resistance properties are maintained, and the thermal conductivity of the composition is improved. The combination of whiteness, reflectance, heat resistance, thermal conductivity and LDS plating properties provide valuable compositions for use in in soldering lighting applications. Such properties are achieved by compositions according to aspects of the disclosure including the use of PCT, glass fiber, LDS additive, titanium and optionally thermal conductive fillers.

For the thermal conductivity (TC) data described herein, pellets extruded from extruder were injection molded into and 80 mm×10 mm×3 mm bar and cut into a 10 mm×10 mm×3 mm square sample for the through-plane TC measurement, and a 100 mm diameter×0.4 mm thick sheet was cut into 25 mm diameter×0.4 thick round samples for the in-plane TC measurement.

Thermal conductivity, (κ, W/m-K), is measured by Nanoflash LFA447 using a pyroceram reference with similar thickness. The measurement determines the thermal diffusivity (α, cm2/s) and the specific heat (Cp, J/g-K) of the sample, together with the density (ρ, g/cm3), which is measured using a water immersion method (ASTM D792). The product of three value gives the thermal conductivity in the through-plane direction and the in-plane direction, according to: $κ = α(T) \, Cp(T) \, ρ(T)$. Each point was repeated three times to ensure the accurate TC was measured.

As noted herein compositions according to aspects of the present disclosure have good heat resistance properties resulting from crystallization of crystalline polymers. A conventional polymer like polyamide has a strong capability to maintain crystallization without easily being destroyed by additives or components. The inclusion of an LDS additive in a polyamide resin system does not adversely affect the heat resistance property of the crystalline polyamide. In PCT resin systems, however, the inclusion of an LDS additive has a detrimental effect on the heat resistance properties of the crystalline PCT. PCT-based compositions according to aspects of the disclosure, however, have improved heat resistance properties even with inclusion of an LDS additive. It was found that the combination of titanium and LDS in PCT well-maintained the heat resistance of PCT. This was a surprising and novel finding.

The data in Example 2 (Tables 2A and 2B) demonstrated the detrimental effect on the crystallization and heat resistance properties of PCT by adding an LDS additive, and further that inclusion of titanium allows the composition to maintain its crystallization and heat resistance properties.

The data in Example 3 (Tables 3A and 3B) demonstrated the effect of the ratio of titanium to LDS additive. The finding of maintaining the heat resistance properties of PCT does not necessarily apply to open or free ratios of titanium and LDS additive Maintaining the ratios of titanium to LDS additive within those described herein, however, provides further novel and inventive performance results.

The data in Example 4 (Tables 4A and 4B) demonstrated the effect of the ratio of titanium to PCT in the disclosed compositions. The finding of maintaining the heat resistance properties of PCT does not necessarily apply to free ratios of titanium and PCT. Maintaining the ratios of titanium to PCT within those described herein, however, provides further novel and inventive performance results.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description as examples or aspects, with each claim standing on its own as a separate aspect, and it is contemplated that such aspects can be combined with each other in various combinations or permutations. The scope of the disclosure should be determined with reference to the appended claims, along with the full scope of equivalents to which such claims are entitled.

What is claimed is:

1. A thermoplastic composition comprising:
   (a) from about 34.3 wt % to about 54.3 wt % poly(cyclohexylenedimethylene terephthalate) (PCT) or a copolymer thereof;
   (b) at least 10 wt % of a reinforcing filler comprising glass fiber;
   (c) from about 2 wt % to about 20 wt % of a laser direct structuring (LDS) additive comprising a tin oxide and an antimony oxide; and
   (d) from about 5 wt % to about 50 wt % of a reflection additive comprising a titanium compound,
   wherein the composition has a dissipation factor (Df) less than 0.01 as determined using an Agilent Split Post Dielectric Resonator at 1.1 gigahertz (GHz), and wherein the combined weight percent value of all components does not exceed 100 wt %, and all weight percent values are based on the total weight of the composition.

2. The thermoplastic composition according to claim 1, wherein the tin oxide or the antimony oxide is in a form of a coating on an additional LDS additive.

3. The thermoplastic composition according to claim 2, wherein the additional LDS additive comprises a titanium oxide.

4. The thermoplastic composition according to claim 1, wherein the composition further comprises a thermally conductive filler different than the reinforcing filler in element (b).

5. The thermoplastic composition according to claim 4, wherein the thermally conductive filler comprises boron nitride.

6. The thermoplastic composition according to claim 1, wherein the composition comprises from about 5 wt % to about 20 wt % of the LDS additive.

7. The thermoplastic composition according to claim 6, wherein the composition comprises from about 10 wt % to about 20 wt % of the reflection additive comprising the titanium compound.

8. The thermoplastic composition according to claim 1, wherein the reinforcing filler further comprises ceramic fiber, carbon fiber, a mineral filler, or a combination thereof.

9. The thermoplastic composition according to claim 1, wherein the composition has a heat distortion temperature (HDT) at 1.82 megapascals (MPa) and a sample thickness of 3.2 millimeters (mm) of at least 220° ° C., or a HDT at 0.45 MPa and a sample thickness of 3.2 mm of at least 200° C.

10. The thermoplastic composition according to claim 1, wherein the composition has an L* of at least 70 as determined in accordance with the CIE L*a*b* color space standard.

11. The thermoplastic composition according to claim 1, wherein the composition has a reflectance of from about 50% to about 95% at a wavelength of from 400 nanometers (nm) to 750 nm.

12. The thermoplastic composition according to claim 1, wherein the composition has an in-plane thermal conductivity of at least 0.5 watts per meter Kelvin (W/(m·K)), or a through-plane thermal conductivity of at least 0.5 W/(m·K).

13. The thermoplastic composition according to claim 1, wherein the composition further comprises one or more additional additives.

14. The thermoplastic composition according to claim 13, wherein the one or more additional additives comprises an impact modifier, acid scavenger, anti-drip agent, antioxidant, antistatic agent, chain extender, colorant, de-molding agent, flow promoter, lubricant, mold release agent, plasticizer, quenching agent, flame retardant, UV reflecting additive, or a combination thereof.

15. An article comprising the thermoplastic composition according to claim 1, wherein the article is a component of a light emitting diode (LED) or a component of a 5G network telecommunications device.

16. The thermoplastic composition according to claim 1, wherein the composition comprises at least about 20 wt % of the reinforcing filler comprising glass fiber.

* * * * *